(12) United States Patent
Easwaran et al.

(10) Patent No.: US 6,804,291 B1
(45) Date of Patent: Oct. 12, 2004

(54) DEVICE AND METHOD OF DIGITAL GAIN PROGRAMMING USING SIGMA-DELTA MODULATOR

(75) Inventors: Prakash Easwaran, Bangalore (IN); Mrinal Das, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/510,085

(22) Filed: Feb. 22, 2000

(51) Int. Cl.$^7$ .................................................. H04B 1/38
(52) U.S. Cl. ...................................... 375/222; 375/247
(58) Field of Search ................................ 375/242, 243, 375/247, 222, 223, 345, 286; 341/126, 143, 144, 155

(56) References Cited

U.S. PATENT DOCUMENTS

| | | | | |
|---|---|---|---|---|
| 5,982,316 A | * | 11/1999 | Shin | ........................ 341/143 |
| 6,304,608 B1 | * | 10/2001 | Chen et al. | .................. 375/252 |
| 6,326,912 B1 | * | 12/2001 | Fujimori | ..................... 341/143 |
| 6,426,714 B1 | * | 7/2002 | Ruha et al. | .................. 341/143 |
| 2004/0021596 A1 | * | 2/2004 | Brooks et al. | ............... 341/144 |

* cited by examiner

*Primary Examiner*—Don N. Vo

(57) ABSTRACT

A sigma delta modulator (350) can be utilized in the Digital-to-Analog (DAC) portion (144) of a modem (120) to achieve a desired level of gain programming. A set of step coefficients (GP2, GP4) are utilized to determined the step size and thereby the overall gain of the modulator (350). A feedback path is provided and configured to deliver the output of the modulator to a gain control block (355) which provides control and stability across the entire transmission bandwidth. A multilevel digital output (320) is provided which represents levels of signal in the digital domain and reduces the number of discrete components required to achieve a particular amount of gain.

21 Claims, 4 Drawing Sheets

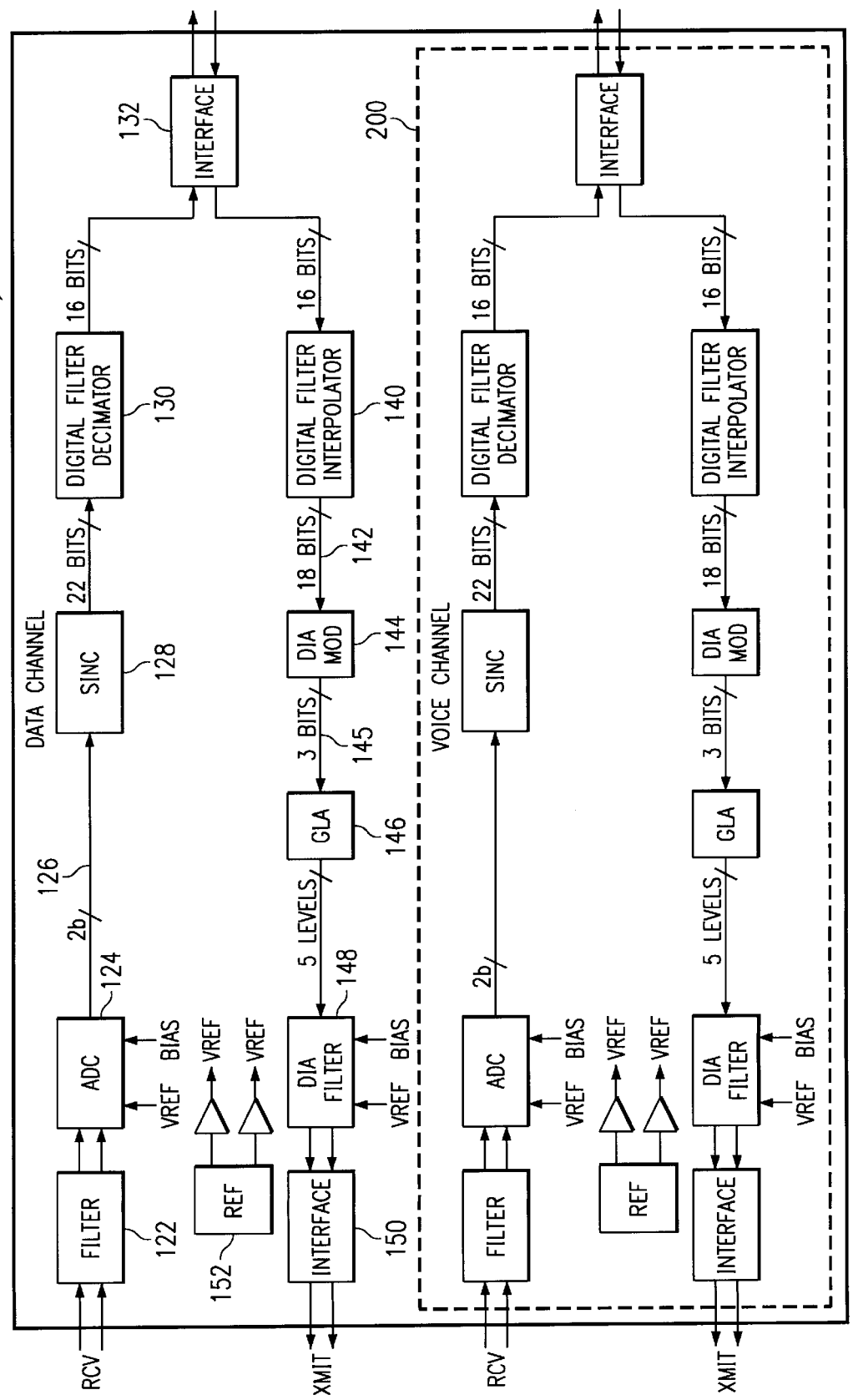

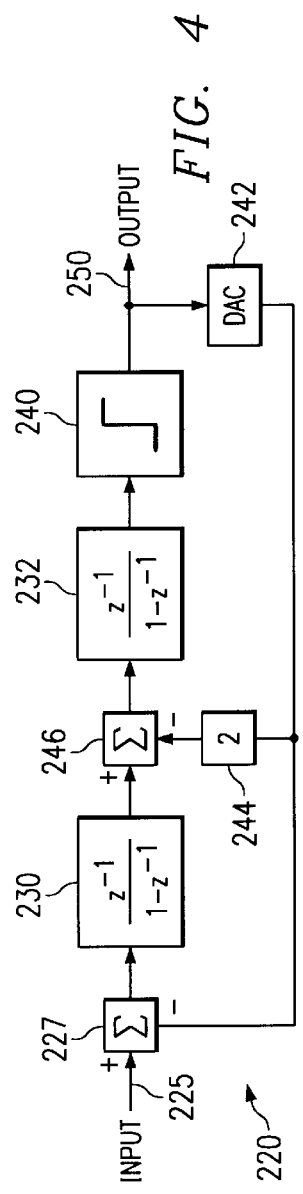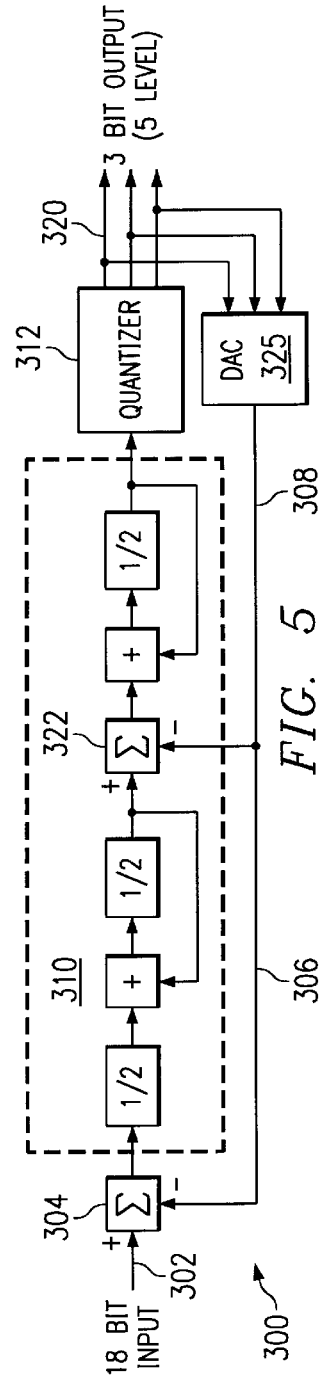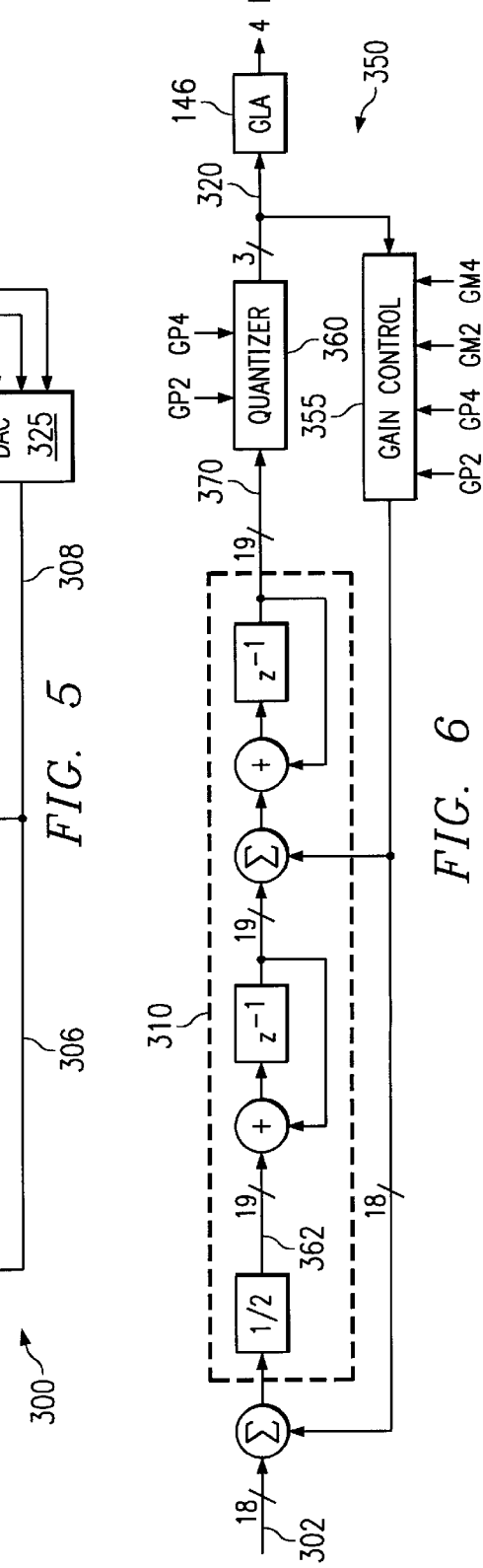

DEVICE AND METHOD OF DIGITAL GAIN PROGRAMMING USING SIGMA-DELTA MODULATOR

TECHNICAL FIELD

The present invention relates generally to communications and more specifically to a sigma-delta modulator implemented in the digital domain for controlling the power and/or volume of outgoing signals based on present line conditions at the interface of a communications device, such as modem, to a communications link, such as a twisted pair connection.

BACKGROUND OF THE INVENTION

The increased use of telephone twisted pair wiring for data communications has resulted in a push for faster modems and improved signaling protocols compatible with the existing infrastructure of the Public Switched Telephone Network (PSTN). For example, the emerging variety of Digital Subscriber Line (DSL) communications protocols including Asymmetric Digital Subscriber Line (ADSL), Symmetric Digital Subscriber Line (SDSL), High Bit Rate Digital Subscriber Line (HDSL) and Very High Rate Digital Subscriber Line (VDSL) promise tremendous gains in throughput over twister pair wiring. Another example includes the wide spread deployment and use of the "56K" technology developed by U.S. Robotics and Rockwall/Lucent.

These and other developing technologies will continue to increase the speed of data and digital voice transmissions in the communications network. In a dial-up network, a modulator/demodulator or "modem" is often used to connect local and remote computers to each other over twisted pair wiring. In essence, a modem provides the communications device for transmitting data from one user system, such as a desktop, notebook or palmtop computer, to another user system at a remote end of a connection. Some modems have the capability to process voice for telephony applications.

The use of such protocols and the resulting increase in data transmission rates have created new challenges and concerns regarding the reliability and integrity of the data as it travels over the communications link. For example, it may be necessary to control the characteristics of the outgoing signals in order to assure a reliable end-to-end transmission. Such characteristics may include the amplitude and linearity of the outgoing signals as well as noise levels and frequency spectrum. Typically, a modem includes a Digital Signal Processor (DSP), an Analog Front End (AFE), a memory chip, interface blocks and power management circuitry among other components which are employed to accomplish such signal management functions.

Some DSPs contain the Analog-to-Digital (A/D) and Digital-to-Analog (D/A) circuitry used to convert analog signals to their digital counterpart and vice versa. In some instances the digital data is companded to increase the data rate and the useful bandwidth. In essence, the DSP provides the modulation and demodulation functions in the digital domain while the AFE is the interface mechanism between the user system and the PSTN.

Depending on line conditions, it may be necessary to control the amplitude and/or volume of outgoing signals for reliable communications using a given protocol. For example, mismatches in line impedance between the communications device, e.g. the modem, and the transmission line can result in nonlinearities and harmonic distortion. Such effects may also be amplified by the nonlinear components in the modem or a Plain Old Telephone System (POTS) coupled to the same wire line pair as the modem. Examples of such nonlinear components include Zener diodes, transistors, varistors, triacs and other devices used for over voltage protection, side-tone generation and over-volume protection, for example.

Power and volume control can be achieved by providing a certain amount of gain programmability in the AFE. For example, by sensing the line condition or determining the required volume setting, the DSP is able to generate appropriate control signals that control amplitudes at the AFE. In one application over twisted pair wiring, typical range of gain control may vary between +12 to 24 dB with gain resolution of +/−2 dB.

Various devices and methods for controlling the gain of outgoing signals have been used and implemented in the past. For example, FIG. 1 shows a prior art programmable gain amplifier 10 implemented as an operational amplifier 12 coupled to a resistor ladder R2. The programmable gain amplifier 10 operates in the analog domain to cause a signal at input terminal 22 to be amplified by the ratio of the resistor ladder R2 and the feedback resistance R1. Gain in the programmable gain amplifier 10 is achieved by selecting the gain settings through gain bits G0:G4 which, in turn, selects one of the resistance values $R_{IN}$ and RG1 through RG4, respectively.

An advantage of the programmable gain amplifier 10 is the ability to generate a relatively stable Signal-to-Noise Ratio (SNR) as the signal at output terminal 30 remains relatively flat for a desired gain setting. As the gain bits G0:G4 are selected, the ratio R1/R2 remains fixed so that the overall realized gain for signals at the input terminal 22 with respect to the output terminal 30 remains relatively constant.

Since the programmable gain amplifier 10 operates in the analog domain, it requires a large number of discrete components to implement. As such, the programmable gain amplifier 10 is a gain solution that consumes considerable board space within the communications equipment. For example, in one known solution, the approximate area consumed by the amplifier 10 for a gain range of between 0 to −24 dB in steps of 2 dB can approach 0.5 Ksqmils. The board space requirements increase with smaller step sizes as more resistance values are necessary to accommodate smaller variations in gain.

Thus, for applications where board space is limited, the gain programming amplifier 10 becomes impractical or impossible to implement. Examples of such applications include portable and palmtop computers systems among other small computing platforms. In addition, since the realized gain of the amplifier 10 is proportional to the ratio R1/R2, any mismatch in values between R1 and R2 means that different devices will have different gain factors at the output terminal 30. Such variances in devices are intolerable in certain applications where precise signal control is required.

While digital programmable gain amplifiers are available, they sacrifice the SNR advantages of analog implementations. What is needed is a way of controlling the power and volume of outgoing signals that fits the confines of limited footprints and board space restrictions found in many compact applications. A programmable gain solution that offers relatively stable SNR across the entire transmission bandwidth would provide numerous advantages.

SUMMARY OF THE INVENTION

The present invention provides a sigma delta modulator that can be utilized in the Digital-to-Analog (DAC) portion of a communications device to achieve gain programming in the digital domain. A set of step coefficients are utilized to determine the step size and thereby the overall gain of the modulator. The step size is delivered to a gain control block which is configured in a feedback arrangement to provide gain control and stability across the transmission bandwidth. A multilevel digital output is provided which represents levels of signal in the digital domain and reduces the number of discrete components utilized by prior art gain programming devices.

As such, according to one embodiment, disclosed is an Analog Front End (AFE) for a communications device comprising an interface to a communications link and a signal converter coupled to the interface and arranged to communicate signals over the communications link. The AFE includes a means of controlling the gain of signals communicated over the interface which, according to one embodiment, is programmable in one or more discrete steps. The means can take the form a gain controller implemented as a sigma delta modulator operating entirely within the digital domain.

According to another embodiment, also disclosed is a signal modulator for use in a communications device comprising an input terminal and a transfer function coupled to the input terminal and configured to receive signals therefrom and to generate converted signals. A quantizer is coupled to said transfer function for receiving the converted signals and for applying one of a plurality of predetermined gain factors to generate a multilevel output. A feedback path extending from the multilevel output to the input terminal is provided and used to control the stability of the gain applied by the quantizer across the entire transmission bandwidth.

According to yet another embodiment, disclosed is a dual channel modem with a data channel and a voice channel, the data channel comprising a receive path including a filter tuned to pass signals within a predetermined data band, an analog-to-digital converter (ADC) coupled to the filter and a digital decimator configured to receive digital signals from the ADC. The data channel also includes a transmit path including an interface to a twisted pair connection, a signal modulator with an output arranged to drive the transmit path via the interface and a digital interpolator arranged to deliver a digital input to the signal modulator with a user system interface coupled to both the digital decimator and the digital interpolator for communicating with at least one user system. Preferably, the signal modulator is capable of delivering a multi-level output that represents the digital signal from the digital interpolator amplified by a predetermined amount of gain.

BRIEF DESCRIPTION OF THE DRAWINGS

Other aspects of the invention including specific embodiments are understood by reference to the following detailed description taken in conjunction with the appended drawings in which:

FIG. 3 is a circuit block diagram of a dual channel modem including the analog front end according to one embodiment;

FIG. 4 shows the basic model for a sigma delta modulator;

FIG. 5 shows a two stage modulator having a quantizer with a multilevel output;

FIG. 6 shows a modulator with programmable gain controlled quantizer operating in the digital domain.

References in the detailed description correspond to like references in the figures unless otherwise indicated.

DETAILED DESCRIPTION OF PREFERRED EMBODIMENTS

The present invention provides a multi-level sigma delta modulator with a digital gain programmability feature that is suitable for use in a communications device such as a modem. In particular, gain programming is achieved in the digital domain by providing a quantizer with multi-level output with a feedback path arranged to provide stability across the entire transmission bandwidth. The multi-level digital output represents levels of signal in the analog domain which can be transmitted over the communications link in the digital domain. Since gain is represented in digital bit sequences, the large number of discrete components required to achieve a particular amount of gain in prior art programmable gain amplifiers is eliminated. While the present invention is described as useful in modems and similar communications equipment, it should be understood that the principles disclosed may have applications to other applications where power and/or volume control is required.

Figure 1:
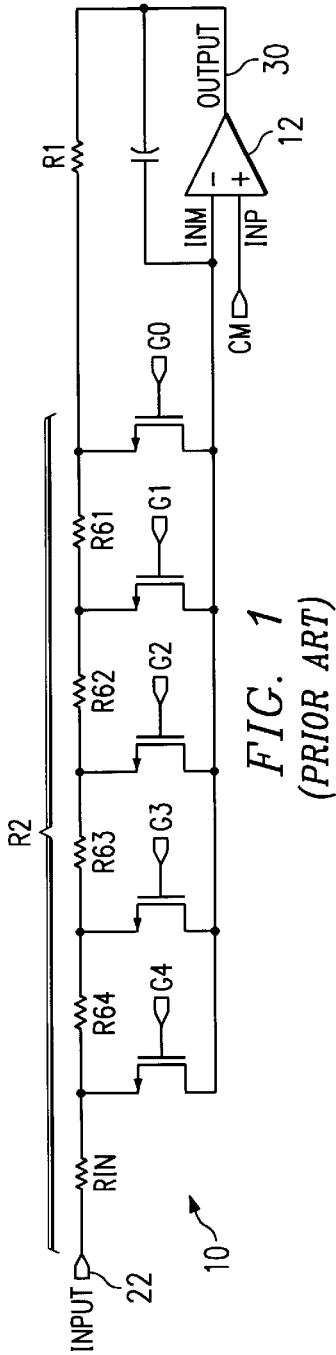
FIG. 1 is a circuit diagram of a prior art programmable gain amplifier 10.

FIG. 1 shows a prior art programmable gain amplifier 10 that can be utilized to provide gain of analog signals at input terminal 22 through the use of a resistor ladder R2 and an operational amplifier 12 arranged in a feedback configuration. As can be appreciated by those of ordinary skill in the art, the amplifier 10 is impractical in applications where board space is limited or where variations in component tolerances can lead to unacceptable variances from one device to another.

Figure 2:
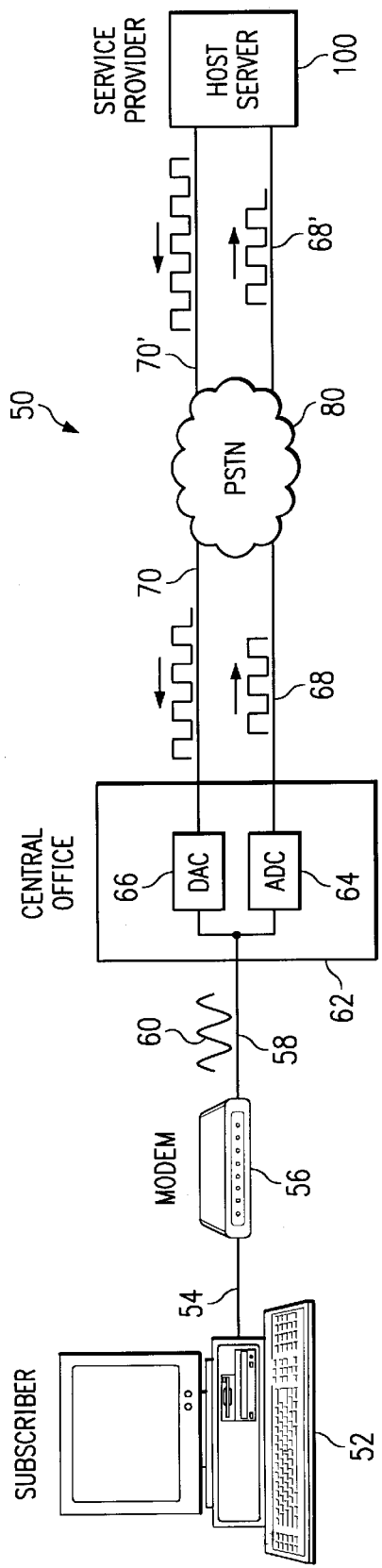
FIG. 2 shows a communications system in which the invention can be practiced.

To better understand the use of the invention, reference is made to FIG. 2 that shows an example communications system 50 in which the invention can be practiced. The communications system 50 is typically utilized by at least one subscriber with a user system 52 that is operably configured to access at least one service provider at a remote location from the subscriber. The service provider typically utilizes a host server 100 or other similar computing platform to provide access by the subscriber to one or more subscriber services. A common example includes access of the Internet or World Wide Web (WWW) through an Internet Service Provider (ISP).

As shown, the user system 52 is operably coupled to a modem 56 or other similar communications equipment, through an interface or communications link 54. The link 54 provides a pathway for unmodulated data transfers between the user system 52 and the modem 56. Typically, the data on the link 54 is in digital format and a communications protocol, such as RS-232or other similar signaling standard, is utilized between the user system 52 and the modem 56. The modem 56 transmits and receives analog signals 60 over a second communications link 58 coupling the modem 56 to a central office facility 62.

Most often, the communications link 58 between the modem 56 and the central office facility 62 is twisted pair wiring of the type commonly employed in numerous installations of the Public Switch Telephone Network (PSTN). The communications link 58 provides the signal pathway for signal transmissions from the user system 52 to the central office facility 62 via the interface provided by the modem 56.

The modem 56 typically employs an internal signal conversion means (not shown in FIG. 2) that facilitates the conversion of digital signals from the user system 52 to analog signals that are transmitted on the communications link 58 to the central office facility 62.

Thus, data from the user system 52 is received by a digital-to-analog converter (DAC) within the modem 56. The DAC is capable of converting digital signals into equivalent analog signals using the appropriate modulation rules that apply to the transmission protocol employed over the communications link 58. Various modulation methods can be employed including, for example, Quadrature Amplitude Modulation (QAM), Frequency Code Encoding (FCE), and Frequency Shift Keying (FSK) among others.

At the central office facility 62, the modulated analog signals 60 are received and converted to their original digital format by the Analog-to-Digital converter (ADC) 64. A digital link 68 between the central office facility 62 and the PSTN 80 provides a signal pathway for the digital output of the ADC 64 which can be represented as a pulse train on the communications link 68.

The PSTN 80 provides a transport mechanism for digital data from the central office facility 62 to the host server 100. In general, the host server 100 resides at the remote end of a connection between the subscriber and the service provider. The host server 100 could provide the access mechanism to the Internet, for example, where an ISP maintains the host server 100 as an entry point for the subscriber into the WWW. Other configurations and uses of the host server 100 are also employed and are well known to those of ordinary skill in the art.

Bi-directional communications between the host server 100 and the user system 52 are illustrated in FIG. 2 and enabled through the communication links 68, 68', 70, 70'. The DAC 66 converts digital bit stream sequences (represented as a pulse train on communications link 70) originating from the host server 100 and arriving through the PSTN 80 into the central office 62. The DAC 66 produces analog signals which are transmitted to the subscriber over communications link 58 using the interface mechanism provided by the modem 56. In this way, the communications system 50 supports downstream and upstream communications between a subscriber and service provider.

The modem 56 includes an Analog Front End (AFE—not shown in FIG. 2) which acts as the interface to the central office facility 62. Typically, a universal asynchronous receiver/transceiver transmitter (UART) or other similar data flow control device is employed within the modem 56 for handling communications between the user system 52 and the modem 56. Likewise, the user system 52 contains suitable application programs, storage devices, memory and processing capabilities to operate the modem 56 and to provide the subscriber with an array of user functions known to those of ordinary skill in the art. The transmit and receive functions of the modem 56 and the ADC 64 and DAC 66 within the central office facility 62 can be implemented using known methods, applications, and devices. For example, the communications standard and protocols utilized between the user system 52 and the central office facility 62 may include those supported and standardized by the International Standard Organization (ISO), the International Telegraph and Telephone Consultative Committee (CCITT) and the Electronics Industry Association (EIA) among others.

The invention has particular application with respect to the interface provided by the modem 56 to the central office facility 62. In particular, the invention is specifically directed at a device and method of controlling the power and/or volume of outgoing signals from the modem 56 in order to accommodate current line conditions found on the communications link 58. In one embodiment, the modem 56 is a equipped with a certain amount of digital gain programmability in the AFE. The architecture of the present invention eliminates the use of resistor ladders and the large number of components found in prior art communication equipment where gain programming is utilized. Thus, signal gain can be accomplished in smaller footprint platforms suitable for notebook and palmtop computers, and mobile computing applications, among others.

With reference to FIG. 3, therein is shown an architectural block diagram of the AFE for a dual channel modem, denoted generally as 120, according to the invention. The modem 120 provides separate channels for data and voice. The primary distinction between the data and voice channels of the modem 120 relate to the bandwidth cut-off points and gain settings for each of the channels. The modem 120 provides a general purpose communications device capable of handling concurrent data and voice sessions within a single communications platform.

Focusing on the data channel of the modem 120 (upper half of FIG. 3), the interface to the telephone network copper wiring includes a filter 122 coupled to the receive path for signals arriving from the PSTN 80. The filter 122 provides a low pass function with an upper cutoff point of approximately 4 kHz according to one embodiment. The filter 122 acts to suppress any high frequency noise beyond the high frequency cutoff point. Received signals are then coupled to Analog-to-Digital Converter (ADC) 124 that samples the incoming analog signal to create a corresponding digital signal that is transmitted along path 126.

In one embodiment, the output on path 126 comprises a 2×16 bit over-sampled digital signal representation of the analog signals received by the modem. Over-sampling of the analog input allows accurate resolution of the modulated analog carrier waveforms received by the modem 120. The processes of over-sampling and converting analog signals to a multi-frame digital bit stream sequences are well known to those of ordinary skill in the art.

The output of the ADC 124 is directed toward a sinc filter 128 that is adapted to filter noise bits contained within the digital sampled output of the ADC 124. The sinc filter 128 works in connection with the digital filter decimator 130 to provide a 16 bit accurate representation of the data encapsulated within the modulated analog carrier waveform received by the data channel of the modem 120 at filter 122.

A 6 bit difference between the output of the sync filter 128 and the output of the digital filter decimator 130 results. The over-sampling function of the ADC 124 tends to introduce noise bits in the stream which, after synchronization, are filtered by the digital filter decimator 130. This provides a mechanism of filtering any noise bits produced by the ADC 124 during conversion. At the output of the digital filter decimator 130 is a 16 bit digital bit stream that is directed towards the system interface 132. The system interface 132 would typically lead to a signal processing device such as a Digital Signal Processor (DSP), micro-processor or other similar computing component that would render the data in a format suitable for use by one or more user systems (not shown).

One the transmit side of the data channel, digital data is received at the interface 132 and is directed as a 16 bit digital stream to the digital filter interpolator 140. The interpolater 140 over-samples the incoming digital bit stream sequence according to a predetermined over-sampling ratio that generates a 16 bit output at terminal 142. The output of the digital filter interpolator 140 is directed to the Digital-to-Analog (D/A) modulator 144 which performs a partial digital to analog conversion function of the data received through terminal 142. The D/A modulator 144 acts as the sigma delta modulator in the digital domain.

The output of the D/A modulator 144 is directed to a group level averaging function 146 which is used to reduce nonlinearities due to mismatches in component values that can affect performance of the dual channel modem 120. Ideally, the output of the D/A modulator 144 would go directly to the analog filter 148. The output 145 of the D/A modulator 144, however, is in the digital domain that can also be represented as some current in the analog domain. This can be achieved, according to one embodiment, by placing capacitors at the input stage of the D/A filter 148.

The placement of capacitors in the signal path between the D/A modulator 144 and the D/A filter 148 would typically cause mismatches in capacitance using standard process fabricated capacitors. Such mismatches can cause nonlinearities in performance of the communications device which can cause distortion at the output. The fact that the group level averaging function 146 is used reduces nonlinearities due to such mismatches and capacitors. According to one embodiment, the group level averaging function 146 includes an algorithm, in the form of software instructions or firmware, that can control the selection of one or more capacitance values belonging to different clocks within the modem 120.

The D/A filter 148 performs the second function in the digital-to-analog conversion algorithm of the modem 120. In one embodiment, the D/A filter 148 comprises an analog low pass filter which cuts off high frequency noise from the previous stage. Since the concept of sigma delta modulation is based on noise shaping, most of the noise within the modem 120 is distributed in the higher range frequencies. For voice applications, however, such noise can be present in lower frequency ranges. For this reason the voice channel 200 of the modem 120 can be tuned and configured to eliminate noise within the lower frequency ranges. The D/A filter 148 cuts off the higher frequency noises and passes signals within the desired bandwidth.

As shown, the output of the D/A filter 148 is directed to an analog interface 150 which provides the connection mechanism to the telephone twisted pair wiring leading to the local central office serving the subscriber. In one embodiment, the impedance of the interface 150 and the driving amplifiers within the interface 150 are set at approximately 800 ohms or the line impedance to permit better transmission of the signal on the wire line pair. The reference system block 152 generates all bias and DC voltages across the modem 120.

The modem 120 also includes a voice channel 200 which is configured substantially as the data channel. The primary difference between the voice channel 200 and the data channel of the modem 120 is that the voice channel 200 is configured to filter signals outside the voice band (300–3.4 kHz) since resolution and over-sampling of the incoming analog signals are not as critical within the voiceband. The inclusion of the voice channel 200 within the modem 120 provides a dual purpose communications device capable of being used for both high rate modulated digital signals and analog voiceband signals.

The invention has particular application with respect to the implementation of the D/A modulator 144 and the use of the D/A modulator 144 to control the power output and/or volume of the communications equipment. While all functionalities are described in the digital domain, it should be understood that it is equally valid for an Analog-to-Digital modulator or a D/A modulator in the analog domain wherein gain programming is required.

FIGS. 4, 5 and 6 illustrate variations of sigma delta modulators suitable for use as a D/A modulator 144 according to various embodiments of the invention. In particular, FIGS. 5 and 6 illustrate modulator implementations operating entirely within the digital domain with both the inputs and outputs being digital. With reference first to FIG. 4, therein is shown the basic model for a sigma delta modulator, denoted generally as 220. The sigma delta modulator 220 assumes that signals at the input 225 are over-sampled to reduce any in band quantization noise that results from the finite number of digital levels used to represent such signals. The quantization noise gets shaped by a high pass transfer function comprised of filters 230 and 232 which attenuate the quantization noise within the desired band and distributes it to much higher frequencies.

In one embodiment, the output terminal 250 of the sigma delta modulator 220 is configured to deliver a level output signal 240 which can be related to an amplitude value in the analog domain. The level output 240 an be represented with a few bits of resolution as illustrated in FIGS. 5 and 6. For example, 5 levels of output could be represented as a 3 bit sequence. Unwanted noise can be reduced by choosing more levels at the output terminal 250 which results in higher resolution from the modulator 220. Such unwanted noise signals can be eliminated by passing signals at the output terminal 250 through a low pass filter (not shown in FIG. 4) which cuts out undesired noise within the transmission band of interest.

The level output 240 of the modulator 220 represents the order of resolution and the number of levels used for a particular modulator design according to various embodiments. As shown, signals at the output terminal 250 are fed back to the D/A block 242 which provides the control mechanism to ensure stability of the modulator 220 across the transmission bandwidth, ensuring that any gain applied by the modulator 220 is stable in relation to the ratio of the signals at the input terminal 225 and the feedback signal appearing at the output terminal 250.

The feedback path is illustrated in a double feedback configuration from the output terminal 250 to both subtractor elements 227 and 246. The gain block 244 provides a fixed amount of gain in the forward path of the signal modulator 220 and determines the overall gain of the modulator 220. In other words, the gain of the signal modulator 220 is directly proportional to the ratio of signals at the input 225 to the feedback signal as seen at the subtractor 246.

FIG. 5 is a block diagram of a two stage sigma delta modulator, denoted generally as 300, with a quantizer element 312 driving a multi-level output terminal 320. As with modulator 220, the modulator 300 is suitable for use in the a communications device, such as the dual channel modem 120, where gain programming is required to control the amplitude and/or volume of outgoing signals. Since signals at the input 302 and output 320 of the modulator 300 are digital, the modulator 300 operates entirely in the digital domain. The principles of the modulator 300, however, can be applied to an Analog-to-Digital Converter (ADC), as well as to DAC and ADC designs in the analog domain.

At the input terminal 302 of the modulator 300, an 18 bit digital signal is directed into a first subtractor element 304.

The output of the subtractor element 304 is a sum of the feedback signal 306 and the 18 bit digital signal at the input terminal 302. This sum is directed towards the transfer function 310 that defines the Q of the modulator 300. In the forward direction, the signal arrives at the quantizer 312 which, in turn, converts the 18 bit input signal 302 into a multiple-level signal at output terminal 320. The fact that the modulator 300 incorporates a quantizer 312 allows the digital gain programming advantages of the present invention.

As shown, signals at the output terminal 320 are directed in a feedback loop to a DAC circuit 325 which provides a feedback path into the subtractor elements 304 and 322 of the modulator 300. The DAC circuit 325 within the feedback path controls the gain realized at the output terminal 320. In addition, the DAC circuit 325 provides a mechanism for correcting errors that are introduced from the conversion function that results as the 18 bit signal at input terminal 302 is converted to a multilevel signal at terminal 320.

The DAC circuit 325 (when configured in a double feedback configuration through paths 306, 308) can now be used to offset any gain realized as signals at the input 302 are driven in the forward path towards the transfer function 310. In this way, the transfer function 310 becomes more stable and the modulator 300 exhibits no gain. Gain is achieved at the quantizer 312 based on the particular bit representation which corresponds to the desired level of gain. For example, in one embodiment signals at the output terminal 320 of the quantizer 312 are configured in 5 levels or "steps" which, in turn, are represented as current in the analog domain and as 3 bits of resolution in the digital domain. It should be understood that more or less levels of gain programming can be achieved by increasing or decreasing the step size and therefore the number of levels of signal seen at the output terminal 320 of quantizer 312.

Referring now to FIG. 6 a variation of the modulator 300 illustrating the signal flow and gain control features of the invention according to one embodiment is shown and denoted generally as 350. A modified quantizer 360 is now provided and is adapted to accept step coefficients GP2 and GP4 as inputs that control the amount of gain applied by the quantizer 360. Thus, the step coefficients determine the step size and thereby the gain of the modulator 350 to be applied to signals at the output terminal 320. The step size is configured in a feedback arrangement to a gain control block 355 which, in turn, is configured in a double feedback arrangement in the DAC modulator 350.

The input 302 remains the same and comprises an 18 bit digital signal which is converted to a 19 bit sequence 362 after addition of the sign bit. The sign bit in the sequence 362 provides more resolution as the data enters the transfer function 310 of the modulator 350. The transfer function (or Q) of the modulator 350 are shown in the dotted line portion of FIG. 6. A 19 bit (with sign bit) transformed output signal 370 is directed in the forward path towards the modified quantizer 360 where, after digital gain programming as determined by step coefficients GP2 and GP4, is converted to a multi-level output signal (3 bits in this example) available at the output terminal 320 for the group level averaging function 146. The output of the GLA function 146 is 4 bits in length which represents 3 bits of thermometer code.

Since the input 302 to the quantizer 360 is limited to 18 bits (plus a sign bit), the signal level at the quantizer 360 can swing between a maximum of a +17 bits to a −17 bits. This assumes the quantizer 360 provides 5 levels so that signals at the output terminal 320 can be associated with levels 0, 1, 2, 3 and 4, for example. Alternatively, the output of the quantizer 360 can be represented by values corresponding to −2, −1, 0, 1 and 2, with even distribution above and below the 0 gain mark. These five levels can be represented, for example, as 010, 001, 000, 111, and 110, respectively, at the output terminal 320 according to one embodiment. The fact that the quantizer 360 is configured to deliver a multiple-level signal at output terminal 320 enables the digital gain programming advantages of the invention and reduces the number of discrete components utilized by prior art communications equipment.

An example using step coefficients GP2 and GP4 to realize gain in the modulator 350 illustrates stable operation of the quantizer 360. For example, assuming a gain of 4 dB is required, the quantizer 360 gain can be reduced by a factor of 4 dB using gain reduction coefficients GM2 and GM4 of the gain control block 355. The configuration results in the desired 4 dB overall for the modulator 350 as determined by the transfer function 310 while maintaining the feedback at 0.63 (=−4 dB)×the voltage level obtained at the output 320. Thus, by reducing the step size at the quantizer 360 along with reduction in the feedback path (though gain control block 355) the quantizer 360 itself does not introduce any more than the desired amount of gain for the modulator 350. In the example, the required 4 dB gain is realized while the transfer function 310 of the modulator 350 remains unchanged.

In one embodiment, the modulator 350 is arranged to deliver the maximum possible dynamic range even though the quantizer 360 is gain programmable. Depending on the desired gain programmability, the step size of the quantizer 360 can be altered using gain reduction coefficients GM2 and GM4 and multiplication by the appropriate feedback factor. The fact that the step size of the quantizer 360 is programmable and that the gain control function 355 can be used to multiply the signals at the output 320 by appropriate factors provides a relatively stable SNR across the desired transmission bandwidth. In addition, the feedback path of the modulator 350 provides a device that operates with a relatively stable SNR across the transmission bandwidth.

Figure 7:
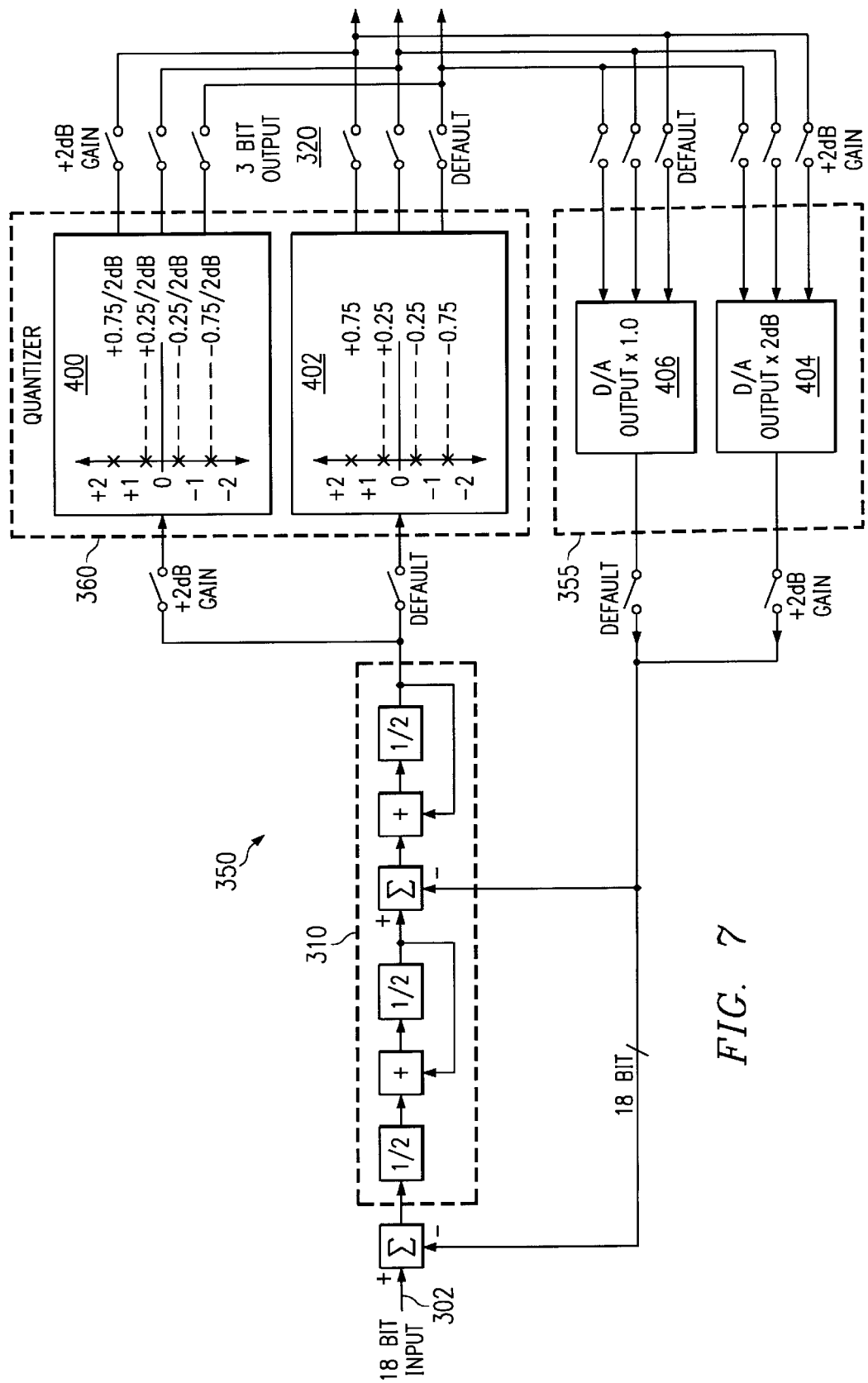
FIG. 7 shows an implementation of a programmable gain controlled quantizer that traces the gain paths for both default and +2 dB gain settings.

FIG. 7 illustrates the gain programming features of the quantizer 360 in further detail assuming a possible 2 dB gain increase. The input 302 is a full scale 18 bit digital stream sequence that follows the forward path of the modulator and reaches the quantizer 360. Depending on the value of the step coefficients (GP2, GP4) the digital signal is directed either to the +2 dB gain block 400 or the default block 402. The step coefficients GP2, GP4 can be used to select either quantization level in the quantizer 312 thereby achieving the desired gain.

As shown, for the selected quantization level, the multi-level 3 bit output of the quantizer 360 is fed back to a corresponding gain control block, either 404 or 406, respectively. Signals at the output terminal 320 of the quantizer 360 then follow the path to the corresponding D/A block 404, 406, respectively, within the gain control function 355 of the modulator 350 which establishes the proper gain path in the DAC portion of the modulator 350. The implementation of gain programming as suggested by FIG. 7 results in desired gain while maintaining the transfer function 310 to avoid undesired nonlinearities in the output of the quantizer 360.

While the invention has been described in connection with preferred embodiments it should be understood that modifications should become apparent to those of ordinary skill in the art and that such modifications are intended to be included within the scope of the invention and the following claims.

What is claimed is:

1. A signal modulator for use in a communications device comprising:
   an input terminal;
   a transfer function coupled to said input terminal and configured to receive signals therefrom, said transfer function configured to generate converted signals;
   a quantizer coupled to said transfer function for receiving said converted signals and configured to apply one of a plurality of predetermined gain factors to generate a multilevel output; and
   a feedback path extending from said multilevel output to said input terminal and said transfer function, said feedback path used to control the gain factor applied by said quantizer to generate said multilevel output.

2. The signal modulator according to claim 1 further comprising an interface coupled to said multilevel output and configured to reduce mismatches in impedance between said signal modulator and other components of said communications device.

3. The signal modulator according to claim 1 wherein said input terminal is adapted to transmit an all digital data stream to said transfer function.

4. The signal modulator according to claim 1 wherein said feedback path further comprises a digital-to-analog signal converter.

5. The signal modulator according to claim 1 wherein said quantizer is configured to generate a 3 bit output.

6. The signal modulator according to claim 5 wherein said 3 bit output is mapped to a five level gain step setting for signals transmitted by said communications device.

7. A dual channel modem for communicating both data and voiceband signals over a communications link comprising:
   a data channel coupled to said communications link and comprising:
      a receive path including a filter tuned to pass signals within a predetermined data band, an analog-to-digital converter (ADC) coupled to said filter and a digital decimator configured to receive digital signals from said ADC;
      a transmit path including an interface to a twisted pair connection, a signal modulator with an output arranged to drive said transmit path via said interface and a digital interpolator arranged to deliver a digital input to said signal modulator; and
      a user system interface coupled to both said digital decimator and said digital interpolator for communicating with at least one user system;
      wherein said signal modulator is capable of delivering a multi-level output that represents said digital signal from said digital interpolator amplified by a predetermined amount of gain; and
   a voice channel coupled to said communications link adjacent said data channel and operably configured to communicate voiceband signals.

8. The modem of claim 7 wherein said ADC is configured to over-sample incoming analog signals received over said communications link.

9. The modem of claim 8 further comprising a synchronization function interspersed between said ADC and said digital decimator along said receive path and adapted to adjust for noise residing within digital data sequences generated by said ADC as a result of over-sampling.

10. The modem of claim 7 wherein said ADC is configured to generate a 2 by 16 bit digital output representation of analog signals received from said communications link.

11. The modem of claim 7 wherein said signal modulator is a sigma-delta modulator.

12. The modem of claim 11 wherein said sigma-delta modulator comprises:
   an input terminal;
   a transfer function adapted to receive digital sequences from said digital interpolator through said input terminal and having an output; and
   a quantizer coupled to said output of said transfer function and configured to deliver multi-level output that represents levels of signals to be transmitted over said communications link in the digital domain.

13. The modem of claim 12 further including a feedback path extending from said multi-level output to said input terminal.

14. The modem of claim 13 wherein said feedback path is further arranged in a double feedback arrangement to deliver said multi-level output both to said input terminal and said transfer function and thereby provide a stability across the entire bandwidth of interest.

15. The modem of claim 13 further comprising a Digital-to-Analog Converter (DAC) interspersed in said feedback path between said multi-level output and said input terminal.

16. The modem of claim 13 further including a gain control function interspersed in said feedback path between said multi-level output and said input terminal.

17. The modem of claim 16 wherein said gain control function is configured to offset any gained realized in said quantizer so that said quantizer does not add overall gain to the modulator.

18. The modem of claim 12 wherein said quantizer is configured to accept step control coefficients that determine the gain setting of said modulator.

19. The modem of claim 12 further comprising a group level averaging function coupled to said quantizer and configured to reduce nonlinearities due to mismatches in component values of said modem.

20. The modem of claim 12 wherein said quantizer is configured to deliver a 3-bit output that represents a level of current in the analog domain.

21. The modem of claim 12 wherein said transfer function is 2 stage.

* * * * *